United States Patent
Kang et al.

(10) Patent No.: US 11,919,122 B2
(45) Date of Patent: Mar. 5, 2024

(54) POLISHING HEAD, SUBSTRATE PROCESSING APPARATUS INCLUDING THE SAME AND PROCESSING METHOD OF SUBSTRATE USING THE SAME

(71) Applicants: Samsung Display Co., LTD., Yongin-si (KR); KCTECH CO., LTD., Anseong-si (KR)

(72) Inventors: Seung Bae Kang, Suwon-si (KR); Sung Hyeon Park, Anseong-si (KR); Jung Gun Nam, Suwon-si (KR); Joon-Hwa Bae, Suwon-si (KR); Kyung Bo Lee, Anseong-si (KR); Keun Woo Lee, Anseong-si (KR); Woo Jin Cho, Yongin-si (KR); Byoung Kwon Choo, Hwaseong-si (KR)

(73) Assignees: SAMSUNG DISPLAY CO., LTD., Gyeonggi-Do (KR); KCTECH CO., LTD., Gyeonggi-Do (KR)

( * ) Notice: Subject to any disclaimer, the term of this patent is extended or adjusted under 35 U.S.C. 154(b) by 403 days.

(21) Appl. No.: 17/036,062

(22) Filed: Sep. 29, 2020

(65) Prior Publication Data
US 2021/0114163 A1 Apr. 22, 2021

(30) Foreign Application Priority Data
Oct. 22, 2019 (KR) .................... 10-2019-0131321

(51) Int. Cl.
*B24B 37/015* (2012.01)
*B24B 37/04* (2012.01)
(Continued)

(52) U.S. Cl.
CPC .......... *B24B 37/015* (2013.01); *B24B 37/042* (2013.01); *C03C 19/00* (2013.01);
(Continued)

(58) Field of Classification Search
CPC ......... B24B 7/06; B24B 31/05; B24B 37/015; B24B 37/042; C03C 19/00; H01L 27/3262; H01L 51/0096
(Continued)

(56) References Cited

U.S. PATENT DOCUMENTS 6,602,121 B1 8/2003 Halley
6,626,744 B1 9/2003 White et al.
(Continued)

FOREIGN PATENT DOCUMENTS

EP 3012067 A2 * 5/2015 ............. B24B 21/04
KR 10-0506235 B1 8/2005
(Continued)

OTHER PUBLICATIONS

English translation of WO 2019187814A1 (Year: 2019).*
English translation of KR 20140092273A (Year: 2014).*

*Primary Examiner* — Laura C Guidotti
*Assistant Examiner* — Sukwoo James Chang
(74) *Attorney, Agent, or Firm* — CANTOR COLBURN LLP

(57) ABSTRACT

A substrate processing apparatus includes: a conveyor belt configured to have an outer surface on which a bottom surface of a substrate is seated; and a polishing head unit configured to face an upper surface of the substrate, wherein the polishing head unit includes: a polishing head connected to a driver; a polishing pad configured to face the polishing head; a polishing pad fixing ring disposed between the polishing head and the polishing pad; and a temperature sensor configured to overlap the polishing pad fixing ring and to be spaced apart from the polishing pad fixing ring.

10 Claims, 7 Drawing Sheets

(51) Int. Cl.
*C03C 19/00* (2006.01)
*H01L 27/12* (2006.01)
*H01L 29/66* (2006.01)
*H10K 59/121* (2023.01)
*H10K 71/00* (2023.01)
*H10K 71/20* (2023.01)
*H10K 71/70* (2023.01)
*H10K 77/10* (2023.01)
*H01L 29/768* (2006.01)
*H01L 29/786* (2006.01)
*H10K 59/12* (2023.01)

(52) U.S. Cl.
CPC ......... *H10K 59/1213* (2023.02); *H10K 71/00* (2023.02); *H10K 71/20* (2023.02); *H10K 71/70* (2023.02); *H10K 77/10* (2023.02); *H01L 27/1218* (2013.01); *H01L 27/1222* (2013.01); *H01L 27/1262* (2013.01); *H01L 27/1274* (2013.01); *H01L 29/6675* (2013.01); *H01L 29/78672* (2013.01); *H10K 59/1201* (2023.02)

(58) Field of Classification Search
USPC .............................................. 451/41
See application file for complete search history.

(56) References Cited

U.S. PATENT DOCUMENTS

| | | | |
|---|---|---|---|
| 2014/0273763 A1 | 9/2014 | Lee et al. | |
| 2017/0338158 A1* | 11/2017 | Sukegawa | H01L 21/02016 |
| 2018/0071889 A1* | 3/2018 | Huang | G08C 17/02 |
| 2018/0203090 A1* | 7/2018 | Xu | G01R 35/005 |
| 2019/0030675 A1* | 1/2019 | Chen | B24B 37/20 |
| 2019/0193237 A1* | 6/2019 | Motoshima | B24B 37/015 |

FOREIGN PATENT DOCUMENTS

| | | | | |
|---|---|---|---|---|
| KR | 20140092273 A | * | 7/2014 | ............. B24B 37/32 |
| KR | 1020160128541 A | | 11/2016 | |
| KR | 10-1932431 B1 | | 12/2018 | |
| KR | 1020190049425 A | | 5/2019 | |
| WO | WO2019187814 A1 | * | 10/2019 | ............. B24B 37/32 |

\* cited by examiner

POLISHING HEAD, SUBSTRATE PROCESSING APPARATUS INCLUDING THE SAME AND PROCESSING METHOD OF SUBSTRATE USING THE SAME

This application claims priority to Korean Patent Application No. 10-2019-0131321 filed on Oct. 22, 2019, and all the benefits accruing therefrom under 35 U.S.C. § 119, the entire contents of which are incorporated herein by reference.

BACKGROUND (a) Field

The present disclosure relates to a polishing head unit, a substrate processing apparatus including the same, and a substrate processing method using the same.

(b) Description of the Related Art

In general, a glass substrate having excellent strength and transmittance is used in a display device. A display device which is slimmer and has an increased number of pixels includes a corresponding glass substrate. The glass substrate of the display device may be polished.

SUMMARY

Exemplary embodiments have been made in an effort to provide a polishing head unit for measuring a temperature of a polishing pad in real time in a polishing head for polishing a substrate having a relatively large planar area, a substrate processing apparatus including the same, and a substrate processing method using the same.

An exemplary embodiment of the invention provides a substrate processing apparatus including: a polishing head; a polishing pad attachable to the polishing head and with which a substrate is polished; a polishing pad fixing ring which is between the polishing head and the polishing pad and attaches the polishing pad to the polishing head in polishing of the substrate; a conveyor belt corresponding to the polishing head and with which the substrate is movable to and from the polishing head; and a temperature sensor. The polishing pad attached to the polishing head by the polishing pad fixing ring, disposes the temperature sensor adjacent to the polishing pad fixing ring, and the polishing of the substrate includes the temperature sensor adjacent to the polishing pad fixing ring measuring a temperature of the polishing pad by sensing a temperature of the polishing pad fixing ring.

The polishing head may include a fixing ring attachment portion that overlaps the polishing pad fixing ring, and the fixing ring attachment portion may include a magnet.

The polishing pad fixing ring may include a metal.

The temperature sensor may be an optical temperature sensor.

The polishing head unit may move along a predetermined path.

The conveyor belt may circularly rotate along a path defined by a roller unit, and the substrate may be selectively conveyed by circular rotation of the conveyor belt.

The roller unit may include a first roller and a second roller disposed to be spaced apart from each other, and the conveyor belt may be circularly rotated by the first roller and the second roller.

The polishing pad may have a smaller planar area than that of the substrate.

The substrate processing apparatus may further include a substrate support facing the polishing head with the conveyor belt therebetween, and a retainer guard disposed on the substrate support to surround an outer edge of the substrate.

The substrate processing apparatus may further include a cleaning unit which cleans the polishing pad.

An exemplary embodiment of the invention provides a polishing head unit including: a polishing head; a polishing pad attachable to the polishing head and with which a substrate is polished; a polishing pad fixing ring which is between the polishing head and the polishing pad and attaches the polishing pad to the polishing head in polishing of the substrate; and a temperature sensor. The polishing pad attached to the polishing head by the polishing pad fixing ring, disposes the temperature sensor adjacent to the polishing pad fixing ring, and the polishing of the substrate includes the temperature sensor adjacent to the polishing pad fixing ring measuring a temperature of the polishing pad by sensing a temperature of the polishing pad fixing ring.

The polishing pad fixing ring may be removably attachable to the polishing head.

The polishing head may include a magnet, and the polishing pad fixing ring may be removably attachable to the polishing head by the magnet. The magnet may be disposed along an outer edge of the polishing head in a plan view.

The temperature sensor measuring the temperature of the polishing pad includes sensing the temperature of the polishing pad fixing ring in real time.

An exemplary embodiment of the invention provides a substrate processing method including: polishing a substrate with a polishing pad attached to a polishing head by a polishing pad fixing ring; and during the polishing of the substrate, measuring a temperature of the polishing pad by a temperature sensor sensing a temperature of the polishing pad fixing ring; and controlling movement of the polishing head based on the temperature of the polishing pad which is measured by the temperature sensor.

The controlling the movement of the polishing head includes reducing a pressing force of the polishing head or a rotational speed of the polishing pad when the temperature of the polishing pad is higher than a reference temperature or increasing a pressing force of the polishing head or a rotational speed of the polishing pad when the temperature of the polishing pad is lower than a reference temperature.

According to the exemplary embodiments, the temperature of the polishing pad fixing ring adjacent to the polishing pad may be measured in real time when polishing a large area substrate, thereby preventing the failure of the substrate processing apparatus and improving the yield thereof.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
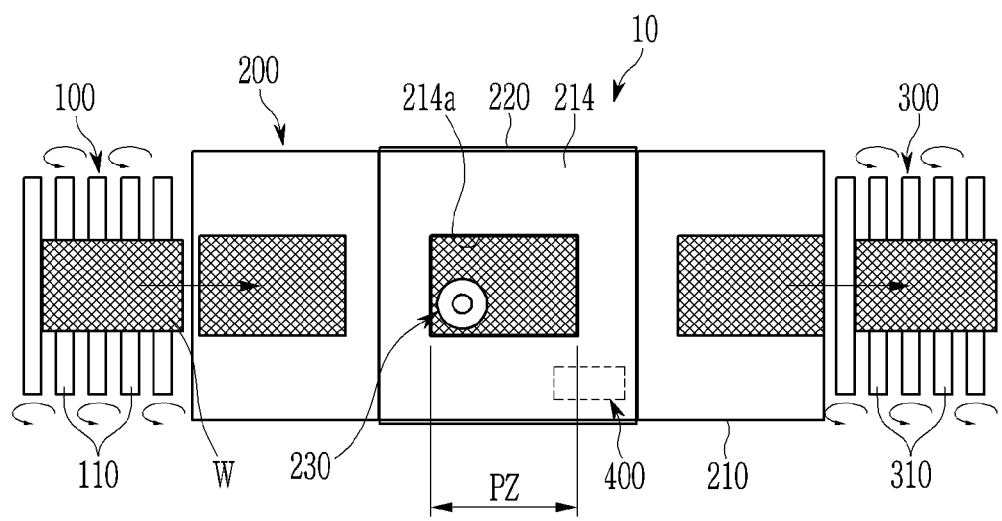
FIG. 1 illustrates a schematic top plan view of an exemplary embodiment of a substrate processing apparatus.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

To clearly describe the invention, parts that are irrelevant to the description are omitted, and like numerals refer to like or similar constituent elements throughout the specification.

Further, since sizes and thicknesses of constituent elements shown in the accompanying drawings are arbitrarily given for better understanding and ease of description, the invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present. Further, the word "over" or "on" means positioning on or below the object portion, and does not necessarily mean positioning on the upper side of the object portion based on a gravity direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper" depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A display device may include an organic light-emitting diode ("OLED") display having a glass substrate. As one of the processes in manufacturing a display device including a glass substrate, as polysilicon (poly-SI) crystallizes, protrusions may occur on a surface of a glass substrate in an excimer laser annealing ("ELA") process in which a laser is applied to amorphous silicon (a-Si) to be crystallized into poly-Si. Such protrusions of the glass substrate within the display device may generate a mura effect in the display device. Thus, the glass substrate of the display device may be polished to remove the protrusions. To this end, various studies have been conducted to efficiently polish the surface of the glass substrate.

Exemplary embodiments of a polishing head unit 230 and a substrate processing apparatus 10 including the same will be described below with reference to FIG. 1 to FIG. 5. FIG.

Figure 2:
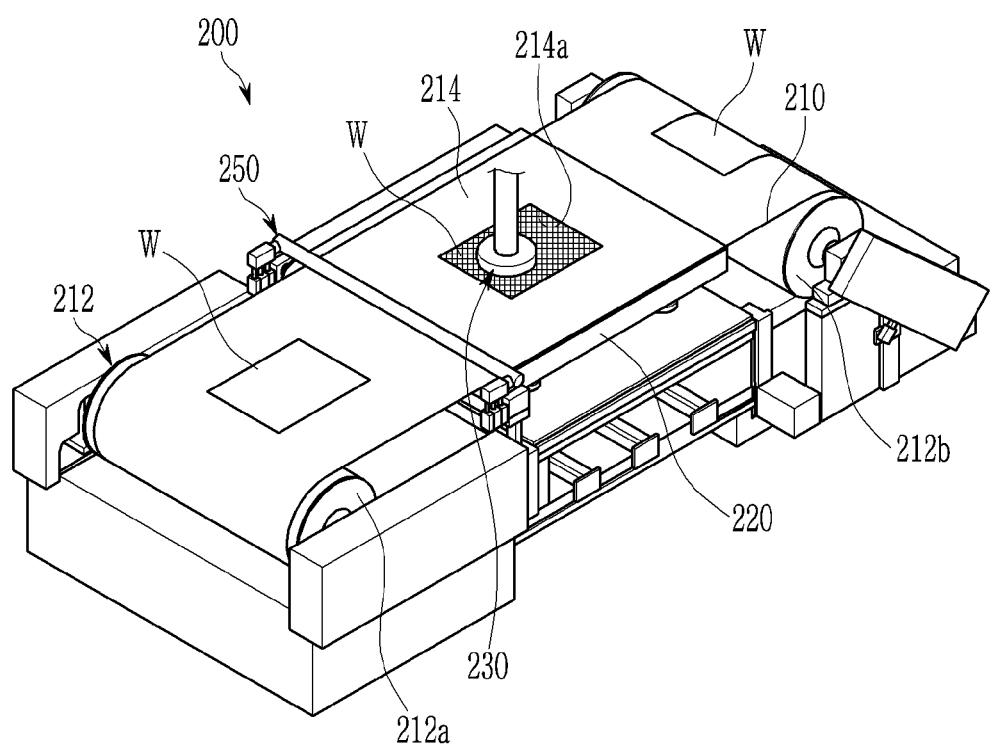
FIG. 2 illustrates a schematic perspective view of an exemplary embodiment of a substrate processing apparatus.
Figure 3:
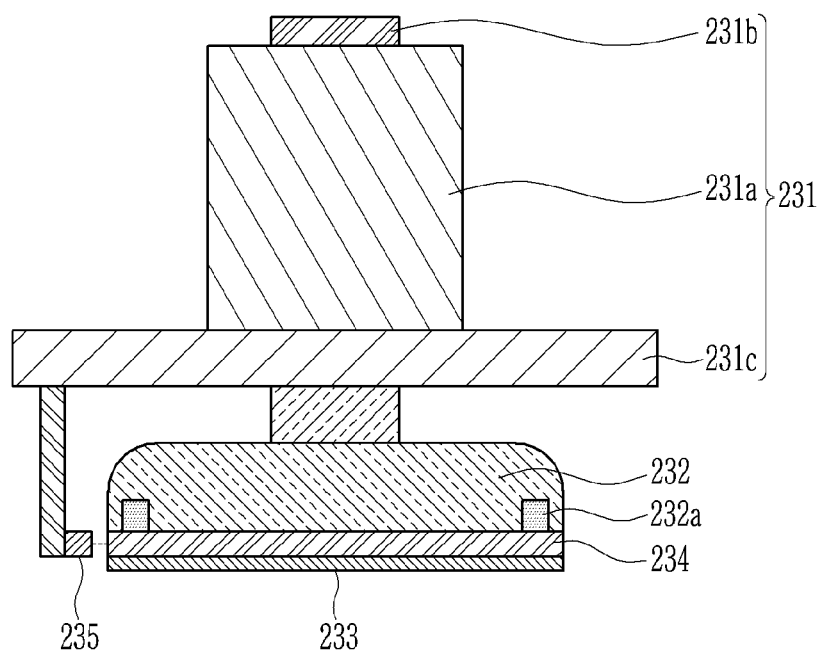
FIG. 3 illustrates a schematic cross-sectional view of an exemplary embodiment of a polishing head unit.
Figure 4:
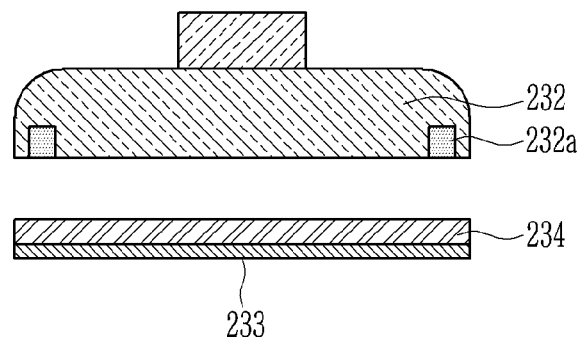
FIG. 4 and FIG. 5 illustrate cross-sectional views of exemplary embodiments of a polishing head unit.
Figure 5:
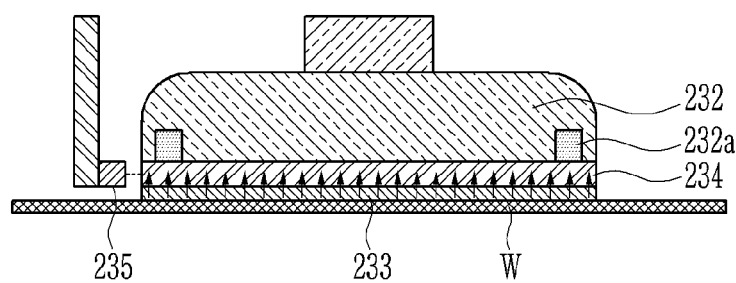

1 illustrates a schematic top plan view of an exemplary embodiment of a substrate processing apparatus 10, FIG. 2 illustrates a schematic perspective view of an exemplary embodiment of a substrate processing apparatus 10, FIG. 3 illustrates a schematic cross-sectional view of an exemplary embodiment of a polishing head unit 230, and FIG. 4 and FIG. 5 illustrate cross-sectional views of constituent elements of exemplary embodiments of a polishing head unit 230.

Referring to FIG. 1 to FIG. 2, a substrate processing apparatus 10 includes a conveyor belt 210 which rotates along a predetermined path and includes an outer surface on which a substrate W is seated, a substrate support 220 disposed inside of the conveyor belt 210 (e.g., facing the polishing head unit 230 with the conveyor belt 210 therebetween) and which faces a lower surface of the substrate W with the conveyor belt 210 interposed therebetween, a polishing head unit 230 (e.g., polisher) which polishes an upper surface of the substrate W which is opposite to the lower surface thereof, and a cleaning unit 400 which cleans a polishing pad 233.

The substrate processing apparatus 10 and components thereof, may be disposed along a plane defined by a first direction and a second direction which cross each other. In FIG. 1, for example, the horizontal direction and the vertical direction of the view may variously represent the first direction and the second direction. A third direction (e.g., thickness direction) of the substrate processing apparatus 10 and components thereof may cross each of the first direction and the second direction. In FIG. 1, for example, the direction into the page may represent the third direction, while the vertical direction in FIG. 2 may represent the third direction.

The conveyor belt 210 is disposed between a loading part 100 (e.g., loading portion) and an unloading part 300 (e.g., unloading portion). The substrate W supplied to the loading part 100 from outside the substrate processing apparatus 10 is conveyed to the conveyor belt 210 to be seated thereon and to be polished by the polishing head unit 230, and then is unloaded to outside the substrate processing apparatus 10 through an unloading conveying rollers 310 of the unloading part 300.

The loading part 100 is provided for loading the substrate W to be polished into a polishing part 200 (e.g., polishing portion). The loading part 100 may have various structures and components capable of transferring the substrate W from outside the polishing part 200 and loading the substrate W on the polishing part 200, and the invention is not limited by a particular structure of the loading part 100.

The loading part 100 may be provided to convey the substrate W to the polishing part 200 at a same height as the conveyor belt 210 (e.g., coplanar with the conveyor belt 210). The loading part 100 includes a plurality of loading conveying rollers 110 that are disposed at a predetermined interval. The substrate W supplied to an upper portion of the loading conveying rollers 110 is transferred or conveyed by the loading conveying rollers 110 as the loading conveying rollers 110 rotate. In some cases, the loading part 100 may include a circulation belt (not illustrated) that is circularly rotated by the loading conveying rollers 110.

Similarly, the unloading part 300 may be provided to convey the substrate W away from the polishing part 200. The unloading part 300 includes a plurality of unloading conveying rollers 310 that are disposed at a predetermined interval. The substrate W supplied to an upper portion of the unloading conveying rollers 310 is transferred or conveyed by the unloading conveying rollers 310 as the unloading conveying rollers 310 rotate. In some cases, the unloading part 300 may include a circulation belt (not illustrated) that is circularly rotated by the unloading conveying rollers 310.

Herein, where the loading part 100 and the conveyor belt 210 convey the substrate W at the same height indicates that a height at which the substrate W is conveyed in the loading part 100, and a height at which the substrate W is seated and conveyed in the conveyor belt 210, are substantially the same.

In addition, the substrate W supplied to the loading part 100 may be aligned by an alignment unit (not illustrated) before being supplied to the loading part 100.

For reference, the substrate W used in the invention may be a substrate W having a quadrangular shape including a side having a length that is greater than about 1 meter (m). In an exemplary embodiment, the substrate W may be used in a display device. In an exemplary embodiment, for example, as the substrate W to be subjected to a chemical mechanical polishing process, a substrate W including glass and having a size of about 1500 millimeters (mm)×1850 mm or more may be used. However, the invention is not limited thereto, and a substrate W defining a side having a length smaller than about 1 m may be used.

The conveyor belt 210 is circularly rotatably provided along a predetermined path to have an outer surface on which the substrate W is seated. The substrate support 220 is disposed inside the conveyor belt 210 (e.g., facing an inner side thereof) to support the lower surface of the substrate W. A polishing head unit 230 is provided to polish the upper surface of the substrate W. Hereinafter, an example in which the conveyor belt 210, the substrate support 220 and the polishing head unit 230 constitute the polishing part 200 will be described.

For reference, in the present specification, the polishing head unit 230 which polishes the substrate W indicates that the polishing head unit 230 polishes the substrate W by a mechanical polishing process or a chemical mechanical polishing ("CMP") process with respect to the substrate W. As an example, while the polishing head unit 230 performs mechanical polishing on the substrate W, a slurry for chemical polishing is supplied to the substrate W during the polishing and the CMP process is performed.

In a processing direction from the loading part 100 to the unloading part 300, the conveyor belt 210 is disposed adjacent to the loading part 100 and may circularly rotate in an infinite loop manner along a predetermined path. The substrate W conveyed from the loading part 100 to the conveyor belt 210 is transferred along the polishing part 200 as the conveyor belt 210 circularly rotates, while being seated on the outer surface of the conveyor belt 210. The processing direction may be disposed in a plane defined by the first direction and the second direction discussed above.

The substrate W conveyed from the loading part 100 to the conveyor belt 210 may be transferred to a polishing zone PZ. The polishing zone PZ may correspond to the substrate support 220 and/or the polishing head unit 230. In addition, the substrate W, which has been polished, may be conveyed from the polishing zone PZ to the unloading part 300 as the conveyor belt 210 is circularly rotated. That is, the substrate W is transferrable to and from the polishing part 200 within the substrate processing apparatus 10, by the conveyor belt 210. Within the polishing part 200, the substrate W is transferrable to and from the substrate support 220.

The circular rotation of the conveyor belt 210 may be performed depending on desired condition and design specifications. In an exemplary embodiment, for example, the conveyor belt 210 is circularly rotated along a predetermined path by a roller unit 212, and the substrate W seated on the conveyor belt 210 is conveyed along a movement path by the circular rotation of the conveyor belt 210. The movement path of the conveyor belt 210 may be a linear movement path.

The movement path (e.g., circulation path) of the conveyor belt 210 may be changed in various ways depending on the condition and design specifications. As an example, the roller unit 212 may include a first roller 212*a* and a second roller 212*b* which is horizontally spaced apart from the first roller 212*a* along the processing direction. The conveyor belt 210 is circularly rotated in the endless loop manner by the first roller 212*a* and the second roller 212*b*.

The outer surface of the conveyor belt 210 indicates an outer surface exposed to the outside of the conveyor belt 210, and the substrate W is seated on the outer surface of the conveyor belt 210. In addition, an inner surface of the conveyor belt 210 indicates the inner surface of the conveyor belt 210 with which the first roller 212*a* and the second roller 212*b* are in contact.

One or both of the first roller 212*a* and the second roller 212*b* may be movable relative to each other, such as to linearly move in a direction toward and away from each other. As an example, a position of the first roller 212*a* may be fixed, and the second roller 212*b* may be movable toward and away from the first roller 212*a*. As such, the tension of the conveyor belt 210 may be adjusted by allowing the second roller 212*b* to move toward and away from the first roller 212*a* depending on manufacturing tolerances and assembly tolerances.

Adjusting the tension of the conveyor belt 210 is defined as adjusting the tension by tightly pulling or loosening the conveyor belt 210. In some cases, a separate tension adjusting roller adjusts the tension of the conveyor belt 210 by moving the tension adjusting roller relative to the conveyor belt 210. However, one or more of the first roller 212*a* and the second roller 212*b* may be movable to improve the structure and space utilization within the polishing part 200 and/or the substrate processing apparatus 10.

The substrate support 220 is disposed inside the conveyor belt 210, and is provided to support the bottom surface of the substrate W with the conveyor belt 210 interposed therebetween. Specifically, the substrate support 220 is disposed inside the conveyor belt 210 so as to face the bottom surface of the substrate W, and supports the inner surface of the conveyor belt 210. In an exemplary embodiment, the substrate support 220 is disposed facing the polishing head 232 with the conveyor belt 210 therebetween.

The substrate support 220 may support the inner surface of the conveyor belt 210 in a variety of ways depending on the desired condition and design specifications. As an example, as illustrated in FIG. 2, the substrate support 220 may be disposed in close contact with the inner surface of the conveyor belt 210 to support the inner surface of the conveyor belt 210.

The deflection of the conveyor belt 210 caused by the weight of the substrate W on the conveyor belt 210 and/or by the substrate W being pressed by the polishing head unit 230, may be reduced or effectively prevented by allowing the substrate support 220 to support the inner surface of the conveyor belt 210. That is, along a thickness direction, the substrate support 220 may provide a force in a direction opposite to a direction of the force provided by the deflection discussed above.

Hereinafter, an example in which the substrate support 220 is provided or formed as a plate having a substantially quadrangular shape will be described. In some cases, the substrate support 220 may be provided formed to have other shapes and structures, and the inner surface of the conveyor belt 210 may be supported by two or more of the substrate support 220 (e.g., substrate supports). In addition, the substrate support 220 may be provided formed to extend in a direction perpendicular to a moving direction of the conveyor belt 210. The moving direction of the conveyor belt 210 may correspond to the processing direction discussed above, without being limited thereto.

Further, in the exemplary embodiment, although an example in which the substrate support 220 supports the conveyor belt 210 at the inner surface thereof in a contact manner has been described, in some cases, the substrate support 220 may support the inner surface of the conveyor belt 210 in a non-contact manner.

The polishing head unit 230 is provided to polish a surface of the substrate W, such as by being in contact with the surface of the substrate W. Hereinafter, exemplary embodiments of the polishing head unit 230 will be described in more detail with reference to FIG. 3 to FIG. 5.

The polishing head unit 230 includes a polishing head 232 connected to a driver 231, a polishing pad 233 corresponding to or overlapping the polishing head 232, and a polishing pad fixing ring 234 (e.g., polishing pad fixing member) disposed between the polishing head 232 and the polishing pad 233.

The driver 231 may have various structures capable of rotating the polishing pad 233. The invention is not limited to or limited by the structure of the driver 231. The driver 231 may be provided or formed to include the polishing head 232 and one body, or may be formed by coupling a plurality of bodies, and may be connected to a drive shaft (not illustrated) to rotate. In an exemplary embodiment, for example, the driver 231 may include a polishing head rotating motor 231*a*, a polishing head rotating shaft 231*b*, and a driver supporting plate 231*c*, but the invention not limited thereto. In addition, the driver 231 may include a pressing unit (e.g., a pneumatic pressing unit for pressing the polishing pad 233 by pneumatic pressure) for pressing the polishing pad 233 to the surface of the substrate W. The polishing pad 233 may be rotatable relative to the surface of the substrate W which is polished by the polishing part 200.

A first end of the polishing head 232 may be connected to the driver 231, and a second end opposite to the first end may be connected to the polishing pad 233 and to the polishing pad fixing ring 234.

The polishing pad 233 may be connected to the polishing head 232 to be rotatable. The polishing pad 233 may have a total planar area which is smaller than a total planar area of the substrate W provided in the substrate processing apparatus 10. The polishing pad 233 may move along the surface of the substrate W while rotating relative to the surface of the substrate W, together with being in contact with the substrate W. Specifically, the polishing pad 233 linearly polishes (e.g., flattens) the surface of the substrate W by rotating while being in contact with the surface of the substrate W. The polishing pad 233 may be in contact and may remain in contact with the substrate W during polishing, by a force applied from the polishing head 232 and the driver 231 which is connected to the polishing head 232.

The polishing pad 233 is provided or formed of a material that is suitable for mechanical polishing of the substrate W. In an exemplary embodiment, for example, the polishing pad 233 may include be formed by using various copolymers such as polyurethanes, polyureas, polyesters, polyethers, epoxies, polyamides, polycarbonates, polyethylenes, polypropylenes, fluoropolymers, vinyl polymers, acrylic and methacrylic polymers, silicones, latexes, nitrided rubbers, isoprene rubbers, butadiene rubber and styrene, butadiene, and acrylonitrile. The material and properties of the polishing pad 233 may be changed in various ways depending on the design specifications.

In an exemplary embodiment, for example, a polishing pad 233 may have a circular shape. A size (e.g., total planar area) of the polishing pad 233 may be smaller than the size of the substrate W. The substrate W may be polished by using a polishing pad 233 having a larger size than that of the substrate W. However, when the polishing pad 233 having the larger size than that of the substrate W is used, a size and space of rotating equipment increases, thereby deteriorating stability during polishing as well as space efficiency and design freedom of a manufacturing process or equipment thereof.

At least one side or edge of the substrate W may be larger than about 1 m, such that rotating a polishing pad 233 having a size larger than that of the substrate W (e.g., a polishing pad 233 having a diameter larger than about 1 m) may be difficult. In addition, when a polishing pad 233 having a non-circular shape (e.g., a square shape) is used for polishing the substrate W, polishing of the surface of the substrate W by the polishing pad 233 which rotates, to have a uniform thickness, may be difficult. However, one or more exemplary embodiment of the polishing head unit 230 may rotate the polishing pad 233 to polish the substrate W without significantly reducing the space efficiency and design freedom of a manufacturing process or equipment thereof. Additionally, one or more exemplary embodiment of the polishing head unit 230 may obtain an advantageous effect of the polishing pad 233 polishing the substrate W uniformly, by rotating the polishing pad 233 which is circular and has a smaller size than that of the substrate W.

The polishing path of the polishing head unit 230 may be variously changed depending on the design specifications. In an exemplary embodiment, for example, the polishing pad 233 may polish the surface of the substrate W while repeatedly moving in a zigzag pattern along the surface of the substrate W with respect to one side or edge of the substrate W, or may move along a straight line.

The polishing head unit 230 includes the polishing pad fixing ring 234 disposed between the polishing pad 233 and the polishing head 232. The polishing pad fixing ring 234 may include or be made of a metal.

The polishing head 232 includes a fixing ring attachment portion 232a. A portion of the fixing ring attachment portion 232a may be exposed to outside the polishing head 232. The fixing ring attachment portion 232a includes a magnetic material (e.g., a magnet). Referring to FIG. 3, the magnet may be disposed along an outer edge of the polishing head 232 in a plan view. Since the fixing ring attachment portion 232a includes a magnetic material, the polishing head 232 may be easily coupled to the polishing pad fixing ring 234 including a metal.

In addition, as illustrated in FIG. 4, the polishing pad fixing ring 234 including the metal, may be attached to and detached from the fixing ring attachment portion 232a including the magnetic material. The fixing ring attachment portion 232a including the magnetic material and the polishing pad fixing ring 234 including the metal material may be separated from and coupled to each other by a predetermined force, without damaging the polishing head 232 or the polishing pad fixing ring 234. Although not illustrated, a used one of the polishing pad 233 may be replaced by another polishing pad 233 since the polishing pad 233 is removably attachable with the polishing head 232 (e.g., attachable to and detachable from).

The polishing head unit 230 may include a temperature sensor 235 corresponding to or overlapping the polishing pad fixing ring 234. The temperature sensor 235 may face a side surface of the polishing pad fixing ring 234, and be spaced apart from the polishing pad fixing ring 234 at a predetermined interval. Contact of the temperature sensor 235 with the polishing pad fixing ring 234 may damage the temperature sensor 235 or separate the temperature sensor 235 from the polishing pad fixing ring 234 during rotation of the polishing pad 233.

The temperature sensor 235 may be an optical temperature sensor. The temperature sensor 235 may be, for example, an infrared optical temperature sensor which is implemented in a non-contact manner. However, the invention is not limited thereto, and other temperature sensors which may have the same function as the infrared optical temperature sensor may be used.

Referring to FIG. 5, in a process of performing a polishing process on one surface of the substrate W, frictional heat may be generated by contact between the polishing pad 233 and the substrate W. The heat from the polishing pad 233 is transferred to the polishing pad fixing ring 234 including metal (indicated by upward arrows in FIG. 5). The temperature of the polishing pad fixing ring 234 which is based on the heat transferred to the polishing pad fixing ring 234, may be sensed and measured by the temperature sensor 235. The temperature sensor 235 may detect the temperature of the polishing pad fixing ring 234 in a non-contact manner. A temperature of the polishing pad fixing ring 234 may define whether the polishing of the substrate W is normal or abnormal.

Since the temperature sensor 235 may detect the temperature of the polishing pad fixing ring 234, detection of whether the polishing is abnormal is possible, by comparing the measured temperature of the polishing pad fixing ring 234 with a reference temperature to reduce or effectively prevent failure of the substrate processing apparatus 10 and to improve the processing yield thereof. In an exemplary embodiment, storage of the reference temperature, retrieval of the reference temperature and the comparison of the temperatures may be performed by or within the substrate processing apparatus 10, without being limited thereto.

In addition, the polishing part 200 may include a retainer guard 214 provided on the outer side of the conveyor belt 210 to surround side surfaces or outer edges of the substrate W. That is, the retainer guard 214 corresponds to an outer edge portion of the substrate W such that the substrate W on the conveyor belt 210 disposes the retainer guard 214 corresponding to the outer edge portion of the substrate W. In more detail, the substrate W disposed at the polishing zone PZ disposes the retainer guard 214 surrounding the outer edge of the substrate W.

The retainer guard 214 may minimize a phenomenon that the polishing pad 233 rebounds at the outer edge portion of the substrate W when the polishing pad 233 of the polishing head unit 230 enters an inner region of the substrate W from an outer region of the substrate W during the polishing process. Additionally, the retainer guard 214 may minimize dead zones (e.g., areas where polishing by the polishing pad 233 is not performed) at the outer edge portion of the substrate W due to the rebounding phenomenon of the polishing pad 233.

In an exemplary embodiment, the retainer guard 214 includes a substrate receiving portion 214a corresponding to a planar shape of the substrate W, and the substrate W may be seated on the outer surface of the conveyor belt 210 and inside a boundary of the substrate receiving portion 214*a*.

When the substrate W is accommodated in the substrate receiving portion 214*a*, an upper surface of the retainer guard 214 may corresponding to a height of the substrate W, particularly at an outer edge of the substrate W. The retainer guard 214 reduces or minimizes a height difference between the surface (e.g., upper surface) of the substrate W which is being polished by the polishing pad 233 and a corresponding upper surface which is adjacent to the substrate W (e.g., upper surface defined by the retainer guard 214). As such, the rebound phenomenon of the polishing pad 233 due to a height deviation between the substrate W and a region outside of the substrate W (e.g., region of the retainer guard 214) may be minimized while the polishing pad 233 moves from the retainer guard 214 to the substrate W, or from the substrate W to the outer region of the substrate W (e.g., region of the retainer guard 214), during the polishing process.

According to an exemplary embodiment, the retainer guard 214 may have a thickness that is smaller than or equal to a thickness of the substrate W. That is, the substrate W in the substrate receiving portion 214*a* may dispose an upper surface of the retainer guard 214 corresponding to (e.g., coplanar with) an upper surface of the substrate W. Where the thickness of the retainer guard 214 is smaller than a thickness of the substrate W, the substrate W in the substrate receiving portion 214*a* may dispose the upper surface of the retainer guard 214 closer to the conveyor belt 210 than the upper surface of the substrate. Again, the rebound phenomenon due to collision between the polishing pad 233 and the retainer guard 214 while the polishing pad 233 moves between the outer region of the substrate W (e.g., at the retainer guard 214) and the substrate W may be reduced or effectively prevented.

In addition, the retainer guard 214 may be provided in plural (e.g., a plurality of retainer guards) on the outer surface of the conveyor belt 210, arranged along the circulation direction of the conveyor belt 210. As such, continuous processing of different ones of the substrate W in an in-line manner may be possible, by providing or forming the plurality of the retainer guard 214 on the outer surface of the conveyor belt 210.

Referring back to FIG. 2, the substrate processing apparatus 10 may further include a fixing unit 250 for fixing the conveyor belt 210 when the substrate W seated on the conveyor belt 210 is conveyed to or disposed in the polishing zone PZ by rotation of the conveyor belt 210.

The fixing unit 250 may suppress movement of the substrate W according to the flow and movement of the conveyor belt 210 while polishing the substrate W, and may improve the polishing uniformity of the substrate W. The substrate W seated on the conveyor belt 210 is polished, and thus when the conveyor belt 210, since the substrate W seated on the conveyor belt 210 moves together with the conveyor belt 210, the flow of the conveyor belt 210 should be restrained while polishing of the substrate W is performed.

The fixing unit 250 may be provided or formed to have various structures capable of fixing the conveyor belt 210, e.g., fixing a position of the conveyor belt 210 together with the substrate W. In an exemplary embodiment, for example, the fixing unit 250 may be provided at the upper portion of the conveyor belt 210 such that the fixing unit 250 is elevated with respect to the conveyor belt 210. The fixing unit 250 may further include a pressing member (not illustrated) for selectively contacting and/or pressing the conveyor belt 210 at the outer surface thereof.

In addition, as illustrated in FIG. 1, the substrate processing apparatus 10 may include a cleaning unit 400. The cleaning unit 400 may minimize a decrease in polishing uniformity caused by a foreign matter (e.g., a slurry) remaining in or on the polishing pad 233. The slurry is a polishing material used during a chemical mechanical polishing process of the substrate W, and may remain on the polishing pad 233, such as in a groove of the polishing pad 233. As described above, when foreign matter remains on the groove of the polishing pad 233 during the polishing process performed on the substrate W, the polishing uniformity of the substrate W may be deteriorated.

One or more exemplary embodiment of the substrate processing apparatus 10 may obtain an advantageous effect of reducing or effectively preventing reduction in polishing efficiency and polishing uniformity caused by foreign particles remaining on the polishing pad 233, by cleaning the substrate W to be polished before seating of the substrate W on the conveyor belt 210.

Figure 6:
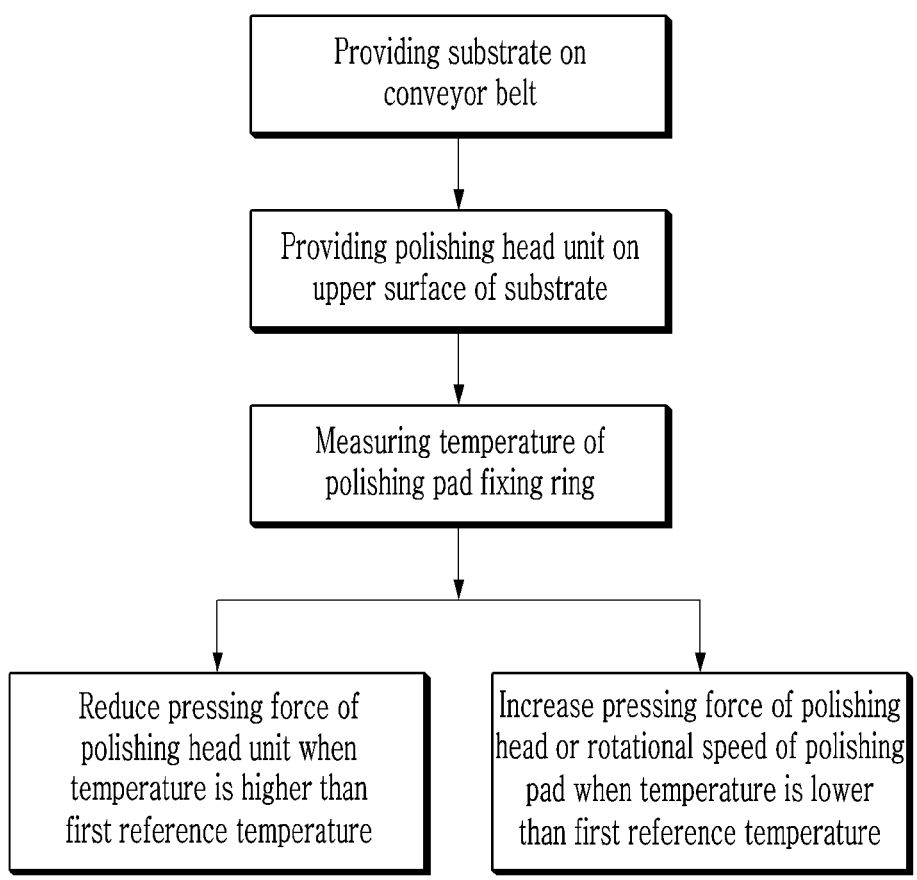
FIG. 6 illustrates a flowchart of an exemplary embodiment of a substrate processing method.

Hereinafter, a substrate processing method using the substrate processing apparatus 10 described with reference to FIG. 1 to FIG. 5, will be described with reference to FIG. 6 and FIG. 7. FIG. 6 illustrates a flowchart of an exemplary embodiment of a substrate processing method using a substrate processing apparatus 10, and FIG. 7 illustrates a graph showing an exemplary embodiment of a substrate processing method with respect to measured temperature that is compared to a reference temperature.

Referring to FIG. 6, an exemplary embodiment of the substrate processing method using the substrate processing apparatus 10 may include providing the substrate W on the conveyor belt 210, providing a polishing head unit 230 on an upper surface of the substrate W to polish the substrate W, sensing and measuring a temperature of the polishing pad fixing ring 234 included in the polishing head unit 230 during the polishing of the substrate W, and controlling movement of the polishing head unit 230 based on the measured temperature of the polishing pad fixing ring 234.

Specifically, the temperature sensor 235 included in the polishing head unit 230 senses and measures the temperature of the polishing pad fixing ring 234 during a polishing process of the substrate W. Heat generated by friction between the substrate W and the polishing pad 233 is transferred to the polishing pad fixing ring 234 including or made of a metal, and the temperature of the polishing pad 233 may be measured by sensing and measuring the temperature of the polishing pad fixing ring 234. That is, the temperature of the polishing pad 233 may be defined or represented by the sensed and measured temperature of the polishing pad fixing ring 234.

Figure 7:
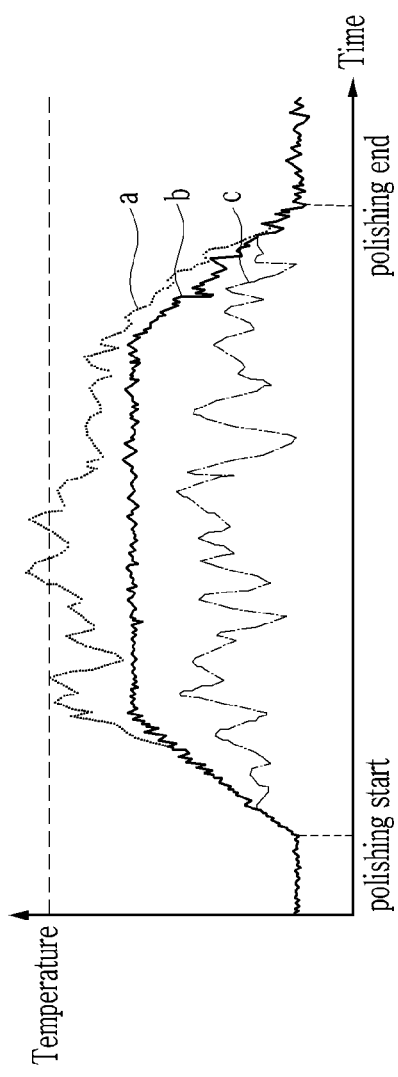
FIG. 7 illustrates a graph showing measured temperatures relative to a reference temperature in an exemplary embodiment of a substrate processing method.

As the polishing process is performed, the temperature of the polishing pad fixing ring 234 may repeatedly rise, fall or maintain substantially constant (e.g., at saturation) as illustrated in FIG. 7. A reference temperature 'b' is defined for the polishing process. The substrate processing apparatus 10 may store, retrieve or otherwise access the reference temperature 'b' during the polishing process. The substrate processing apparatus 10 may determine a status of the polishing process by comparing a measured temperature of the polishing pad 233 (defined by a measured temperature of the polishing pad fixing ring 234) with the reference temperature 'b'. When a predetermined difference occurs between the measured temperature and the reference temperature 'b', the substrate processing apparatus 10 may determine that the status of the polishing process is abnormal.

Specifically, a temperature 'a' measured during the polishing process exceeding a threshold value (indicated by a dotted line in FIG. 7) of the reference temperature 'b', indicates an abnormal status of the polishing process, such as excessive polishing is being performed (e.g., excessive polishing of the substrate W). In this case, operation of the polishing head unit 230 may be changed to reduce the excessive polishing, such as stopping operation of the polishing head unit 230, reducing a rotational speed and/or a pressing force of the polishing head unit 230, etc. Additionally, by change of the operation of the polishing head unit 230, fire due to overheating of the substrate processing apparatus 10 and/or further failure thereof is possible. In an exemplary embodiment, the substrate processing apparatus 10 may generate a notification that the status of the processing process is abnormal and/or operation of components within the substrate processing apparatus 10 should be changed.

In addition, a temperature 'c' measured during the polishing process being lower than the reference temperature 'b' indicates an abnormal status of the polishing process, such as polishing is being insufficiently performed. In this case, operation of the polishing head unit 230 may be changed to increase the rotational speed of the polishing head unit 230 and/or the pressing force of the polishing head unit 230.

According to the above-described exemplary embodiments, since the temperature of the polishing pad fixing ring 234 adjacent to the polishing pad 233 may be measured in real time when polishing a substrate W having a relatively large planar area, immediate and real time control of the polishing of the substrate W based on the measured temperature is possible. Therefore, failure of the substrate processing apparatus 10 and improved yield thereof is possible.

While this invention has been described in connection with what is presently considered to be exemplary embodiments, it is to be understood that the invention is not limited to the disclosed embodiments, but, on the contrary, is intended to cover various modifications and equivalent arrangements included within the spirit and scope of the appended claims.

What is claimed is:

1. A substrate processing apparatus comprising:
   a conveyor belt on which a substrate is seated;
   a polishing head which is connected to a driver and configured to face the substrate; and
   in order between the substrate and the polishing head which faces the substrate:
   a polishing pad having a temperature; and
   a polishing pad fixing member which fixes the polishing head and the polishing pad to each other, directly receives heat from the polishing pad and has a temperature, the polishing pad fixing member extended in a plane between the polishing head and the polishing pad; and
   a temperature sensor which is adjacent to and spaced apart from the polishing pad fixing member, in the plane, the temperature sensor sensing the temperature of the polishing pad fixing member,
   wherein the temperature of the polishing pad is defined by the sensed temperature of the polishing pad fixing member.

2. The substrate processing apparatus of claim 1, wherein the polishing head includes a magnet, and
   the polishing pad fixing member together with the polishing pad is removably attachable to the polishing head by the magnet.

3. The substrate processing apparatus of claim 2, wherein the polishing pad fixing member includes metal.

4. The substrate processing apparatus of claim 1, wherein the temperature sensor includes an optical temperature sensor.

5. The substrate processing apparatus of claim 1, wherein the polishing pad attached to the polishing head is movable together with the polishing head, along the substrate.

6. The substrate processing apparatus of claim 1, further comprising a roller unit along which the conveyor belt is rotatable,
   wherein rotation of the roller unit rotates the conveyor belt along the roller unit to move the substrate to and from the polishing head.

7. The substrate processing apparatus of claim 6, wherein the roller unit includes:
   a first roller and a second roller spaced apart from each other, and
   rotation of the first roller and the second roller rotates the conveyor belt along the roller unit to move the substrate to and from the polishing head.

8. The substrate processing apparatus of claim 1, wherein the polishing pad attached to the polishing head by the polishing pad fixing member, has a smaller planar area than a planar area of the substrate.

9. The substrate processing apparatus of claim 1, further comprising:
   a substrate support facing the polishing head with the conveyor belt therebetween;
   a retainer guard corresponding to the substrate support; and
   a polishing zone corresponding to the substrate support,
   wherein the substrate disposed at the polishing zone disposes the retainer guard surrounding an outer edge of the substrate.

10. The substrate processing apparatus of claim 1, further comprising a cleaning unit which cleans the polishing pad.

* * * * *